United States Patent
Hayami et al.

(10) Patent No.: US 6,683,922 B1
(45) Date of Patent: Jan. 27, 2004

(54) DATA DECODING APPARATUS AND DATA DECODING METHOD

(75) Inventors: Atsushi Hayami, Kanagawa-ken (JP); Makoto Itonaga, Kanagawa-ken (JP)

(73) Assignee: Victor Company of Japan, Limited, Yokohama (JP)

(*) Notice: Subject to any disclaimer, the term of this patent is extended or adjusted under 35 U.S.C. 154(b) by 0 days.

(21) Appl. No.: 09/483,777

(22) Filed: Jan. 18, 2000

(30) Foreign Application Priority Data

Jan. 28, 1999 (JP) .......................... P11-019736
Dec. 6, 1999 (JP) .......................... P11-346745

(51) Int. Cl.[7] .............................................. H04L 27/06
(52) U.S. Cl. ...................... 375/341; 375/262; 714/795
(58) Field of Search ................. 375/262, 263, 375/265, 290, 316, 340, 341; 714/786, 794, 795, 796; 369/59.22; 341/59

(56) References Cited

U.S. PATENT DOCUMENTS 5,341,386 A * 8/1994 Shimoda et al. ............ 714/795
5,392,316 A * 2/1995 Sawaguchi et al. ......... 375/290
5,796,693 A * 8/1998 Taguchi et al. .......... 369/59.22
6,233,289 B1 * 5/2001 Fredrickson ................ 375/341
6,442,730 B1 * 8/2002 Schachner et al. .......... 714/795

FOREIGN PATENT DOCUMENTS

JP            6150549          5/1994

* cited by examiner

Primary Examiner—Chieh M. Fan
(74) Attorney, Agent, or Firm—Nath & Associates PLLC; Gary M. Nath; Marvin C. Berkowitz

(57) ABSTRACT

In a data decoding apparatus that performs decoding of recorded data played back from a recording medium by Viterbi decoding according to a decoding trellis based on a recording signal characteristic, a pathmetric calculation circuit has run length counters (20) and (25) for detecting the run length of recorded data, a target value control circuit (1) for varying the target value used for metric calculation of Viterbi decoding based on run length information, and a monitoring means, provided in the target value control circuit (1), for protecting against faulty operation caused by using a count value that should not be used as an information source.

2 Claims, 5 Drawing Sheets

PATHMETRIC CALCULATION CIRCUIT

PLAYBACK STATE TRANSITIONS FOR 3T LIMITING

DECODING TRELLIS

RUN LENGTH COUNTER OPERATION

TARGET VALUE CONTROL CIRCUIT

DATA DECODING APPARATUS AND DATA DECODING METHOD

BACKGROUND OF THE INVENTION

1. Field of the Invention

The present invention relates to a data decoding apparatus and method applied to a digital recording medium playback apparatus such as an optical disk (disc) or magnetic disk, and more particularly to a data decoding apparatus and method that uses Viterbi decoding in according with a decoding trellis based on the characteristics of the recorded signal to improve the playback performance with playing back the recorded data from the recording medium.

2. Description of the Related Art

In recent years, in recording and playback apparatuses for digital data such as dealt with on digital recording media such as optical and magnetic disks, with the advent of high-density recording of information on a recording medium, playback by the partial response (PR) method has come into use, and Viterbi decoders are commonly used to decode a signal.

When employing the PR method, there are such advantages as being able to maximum the density over a limited signal transmission bandwidth, and when a Viterbi decoder is used it is possible to achieve decoding with superior S/N ratio and low code error rate while making the maximum utilization of the information contained in the playback signal.

In a playback apparatus for a digital recording medium such an optical or magnetic disk such as noted above, asymmetry is know to occur in the playback signal as a result of the recorded pit length and depth. For this reason, in a decoding apparatus in such a playback apparatus, a means for controlling the slice position of the playback signal detection circuit (for example, an autoslicer) is used, this control being based on the asymmetry of the playback signal.

In the Japanese laid-open patent application publication H6-150549 there is disclosure of an optical information playback apparatus which determines compensation information for a Viterbi decoder from an area into which the bit information has been recorded, so as to accommodate asymmetry such as noted above in the playback signal.

With the increase in recording density in recent years, however, the non-linear influence of a prior pit or a land on a following bit has increased to a degree that cannot be neglected, so that the simple asymmetry (linear component) compensation of the past is not sufficient.

Additionally, the compensation of such asymmetrical components is expected to exceed the capabilities of either a waveform equalizing circuit used to perform playback signal compensation or Viterbi decoding for the purpose of accommodating a deterioration in the signal-to-noise ratio of a playback signal attributed to an increase in recording density.

SUMMARY OF THE INVENTION

It is an object of the present invention to provide a data decoding apparatus and data decoding method capable of reducing the non-linear influence of a prior pit or a land on a following bit attributed to increased recording density, and of perform high-quality decoding of even bits that are affected by fluctuations in the playback signal amplitude.

To achieve the above-noted object of solving the problems inherent in the related art, a data decoding apparatus according to the present invention uses Viterbi decoding in accordance with a code trellis based on the characteristics of the recorded code to perform decoding of data that has been recorded onto a recording medium and played back therefrom, and has a run length detection means that detects the run length of the recorded data.

In order to achieve the above-noted object, another aspect of a data decoding apparatus according to the present invention has a target value varying means for varying the target value for performing metric calculation of the Viterbi decoding, based on the run length information detected by the run length detection means.

In yet another aspect of a data decoding apparatus for the purpose of achieving the above-noted object, the run length detection means is formed by a counter to count the run length, and the target value varying means is a monitoring means for protecting against faulty operation caused by using a count value that should not be used as an information source.

More specifically, according to the present invention, in a pathmetric calculation unit when performing Viterbi decoding according to a decoding trellis, by providing a means for detecting a prior pit or land length and a means for varying the target value of the metric calculation based on this detection, even in a case in which, because of an improvement in the recording density, a prior pit or land length has a large effect on a subsequent bit (that is, a bit that is affected by fluctuation in the playback signal amplitude), it is possible to perform signal playback (decoding) under good conditions at all times.

From yet another aspect of the present invention, there is provided a data decoding method of performing decoding of recorded data played back from a recording medium, using Viterbi decoding in accordance with a decoding trellis based on a recorded signal characteristic, comprising the step of:

detecting a run length of recorded data at pathmetric calculating.

DETAILED DESCRIPTION OF THE PREFERRED EMBODIMENTS

A preferred embodiment of the present invention is described in detail below, with references being made to relevant accompanying drawings.

The preferred embodiment is described herein for the case in which the shortest recorded inversion interval is limited to 3T (where T is the bit interval) in the signal recorded on a recording medium is applied to a playback apparatus. Examples of such a recording medium are a Compact Disc and a DVD (Digital Video Disc or Digital Versatile Disc) and the like.

Figure 1:
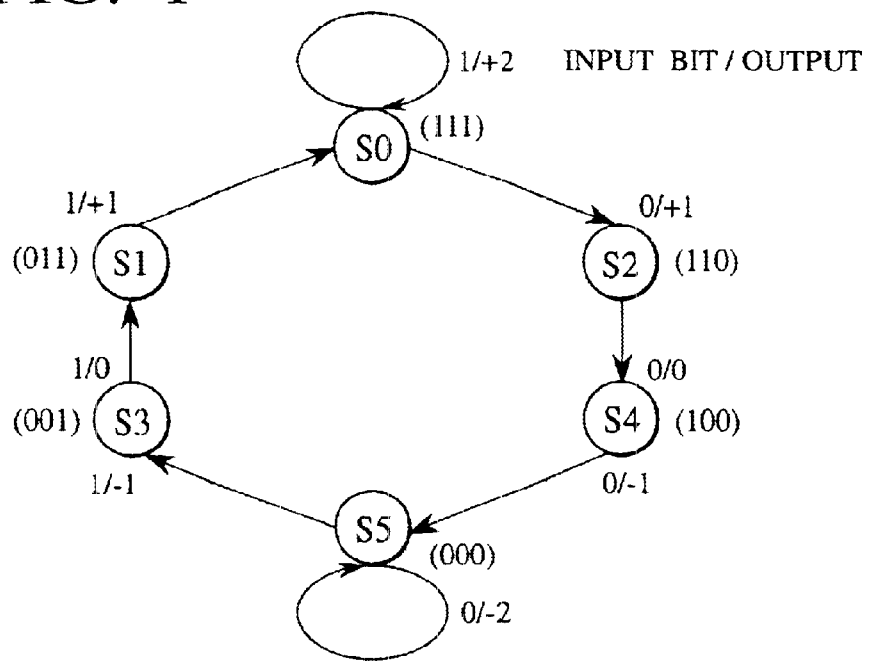
FIG. 1 is a state transition diagram of a data playback system for the case in which the shortest recorded inversion interval is limited to 3T.

FIG. 1 is a state transition diagram used in limiting the minimum recording inversion interval to 3T. FIG. 1 shows the so-called PR (1, 1, 1, 1) characteristics of the response waveform for the symbols 1, 1, 1, 1 with respect to an isolated 1T waveform, this constituting a state transition diagram for the case of data playback by waveform equalization so as to achieve 5 levels from −2 to +2 about the center value of 0. In FIG. 1, the 1s and 0s in parentheses from (000) to (111) indicate the input bits to a playback system having a PR (1, 1, 1, 1) characteristic, and the rightmost bit thereof is the newest bit.

In the state transition diagram of FIG. 1, at the (111) state S0, if the input bit is "1" then "+2" is output and transition is made to state S0, but if the input bit is "0" then "+1" is output and transition is made to state S2. Because the shortest recording inversion interval is limited to 3T, at the (110) state S2 the next input bit will always be "0", in which case "0" is output and transition is made to state S4. At the (100) state S4, the next bit will always be "0", in which case "−1" is output and transition is made to state S5. At the (000) state S5, if the input bit is "0" then "−2" is output and transition is made to state S5, but if the input bit is "1" then "−1" is output and transition is made to state S3. At the (001) state S3 if the input bit is "1" then "0" is output and transition is made to state S1. At the (011) state S1, the next input bit will always be "1", in which case "+1" is output and transition is made to state S0.

Figure 2:
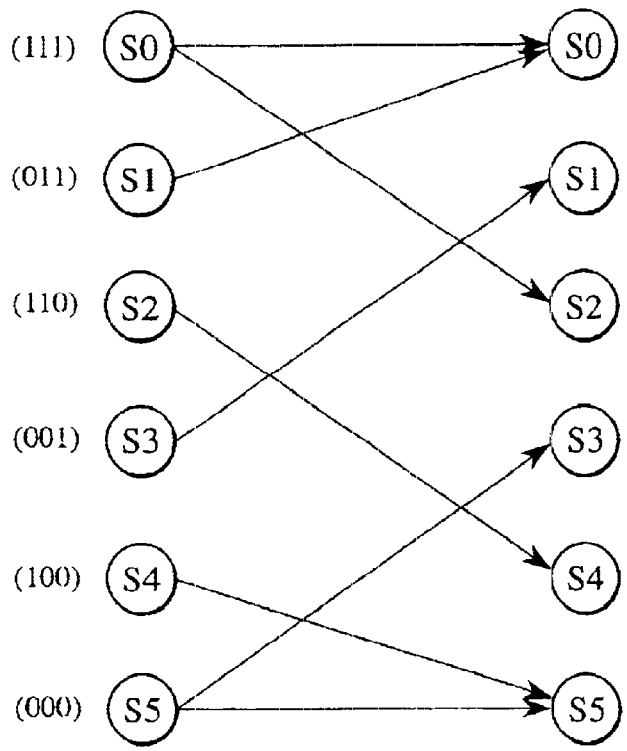
FIG. 2 is a decoding trellis graph corresponding to the state transition diagram of FIG. 1.

FIG. 2 is the decoding trellis diagram that is determined from the state transition diagram of FIG. 1 (by expanding FIG. 1 in the time direction). One arrow from one state to another state in FIG. 2 is a branch, linked branches are called paths, and the likelihood of each branch is called its metric.

The influence of a prior pit or land when data is read (played back) from a recording medium and compensation therefor is described below.

Figure 3:
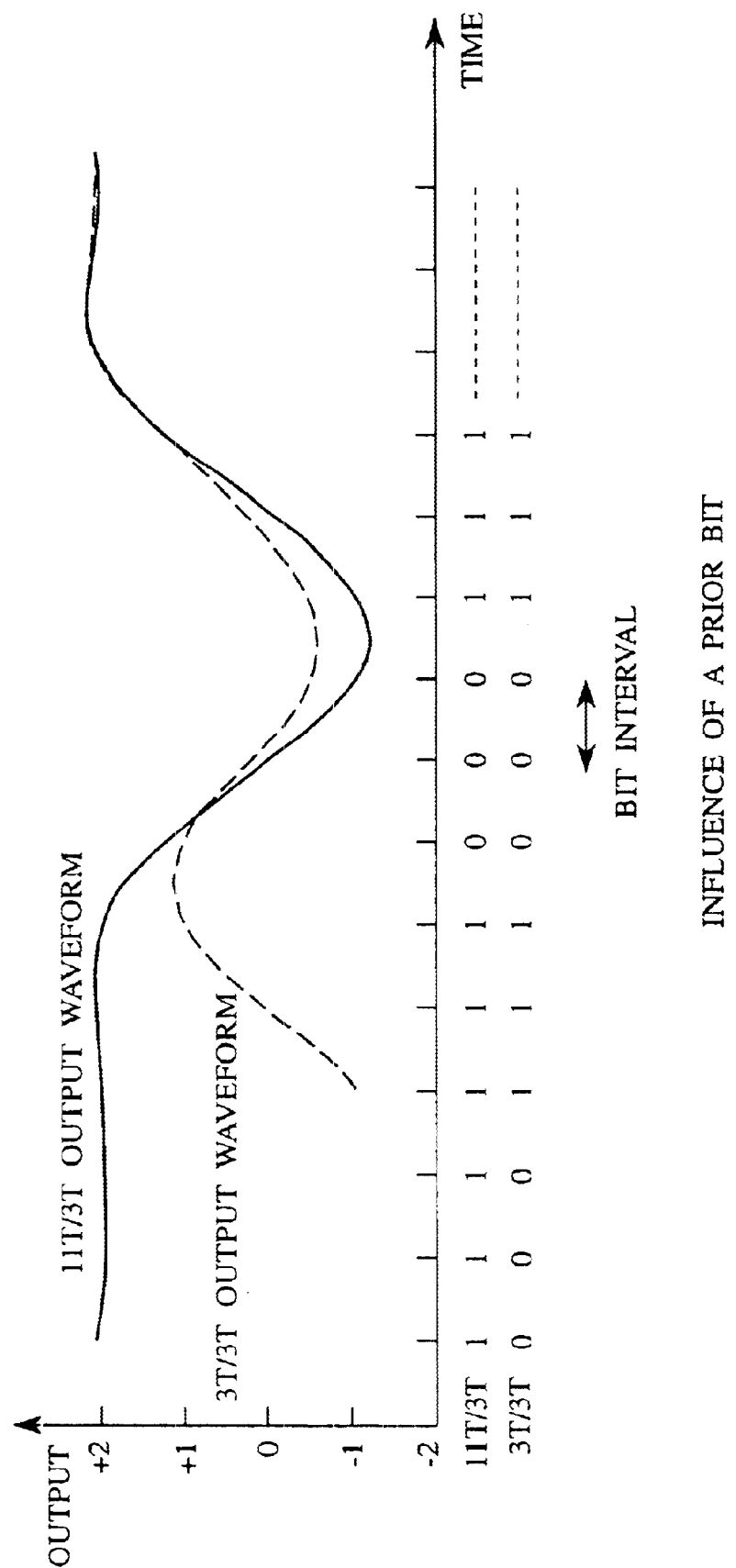
FIG. 3 is a drawing illustrating the effect of a prior bit.

FIG. 3 is a drawing showing the 5-value (−2 to +2) output signal waveform (amplitude waveform) when data is read from a recording medium and playback is performed by a playback system in accordance with the state transition diagram such as shown in FIG. 1, this showing the variation in amplitude for the case in which the previous land length is 3T and the subsequent pit length is 3T (broken-line curved marked 3T/3T) and the variation in amplitude for the case in which the previous land length is 11T and the subsequent pit length is 3T (solid-line curve marked 11T/3T).

As can be seen from the drawing, even if the subsequent pit length is the same length of 3T, if the length of the previous land differs (that is, if the run length of the previous data differs), there is a difference in the waveform data values that are output. Thus, the data values output from the playback system include an error that is caused by the run length of previous data, making it necessary to perform decoding after correcting this error.

In these examples, for the case in which the decoding trellis of FIG. 2 is used, because states having a plurality of path inputs are only S0 and S5, in the data decoding apparatus, the CS (comparison selection) operation that establishes selection of the path memory need only be performed with respect to selection of the path input at the states S0 and S5.

Figure 4:
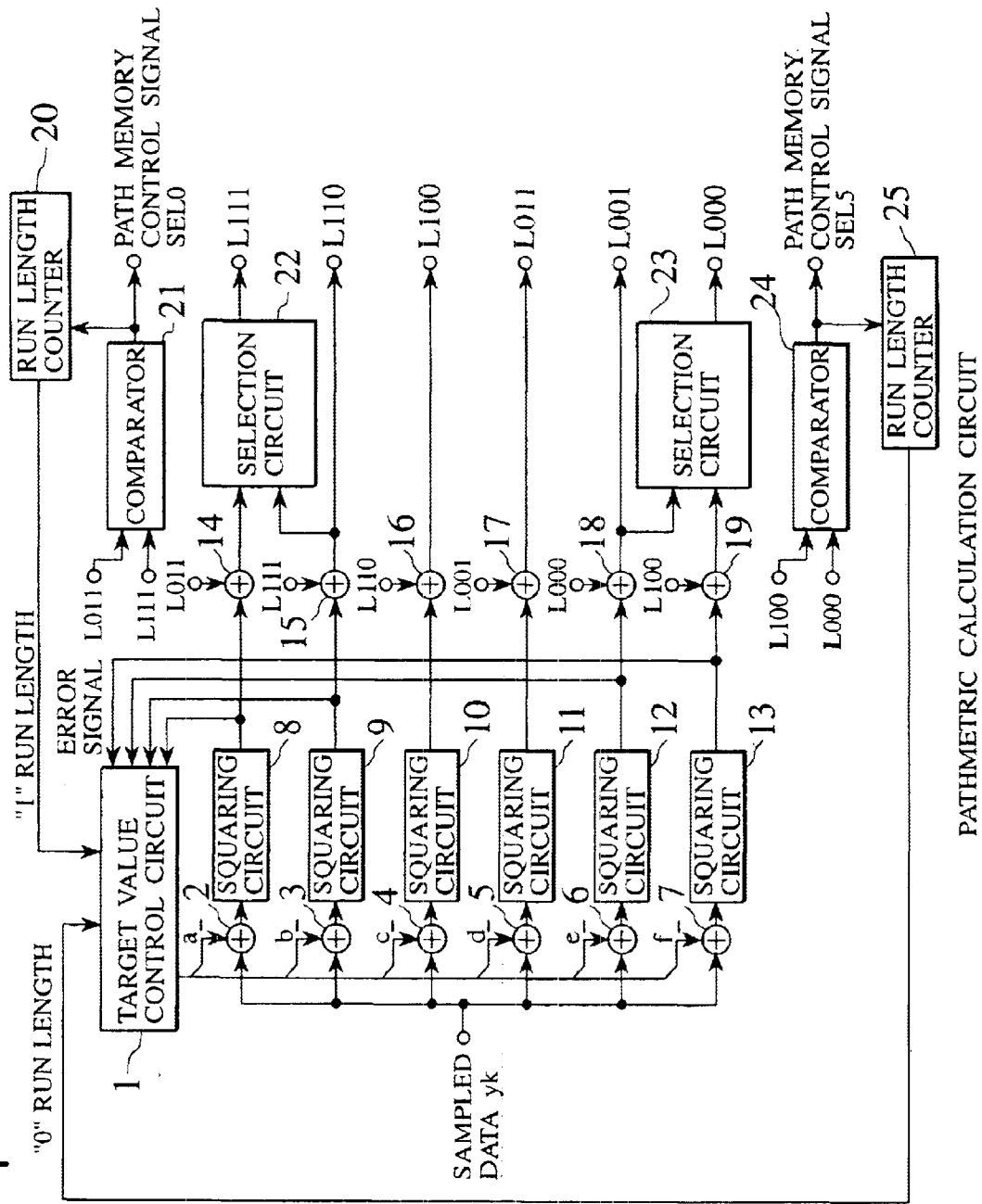
FIG. 4 is a block diagram showing an example of the configuration of a pathmetric calculation circuit of a Viterbi decoding circuit according to an embodiment of the present invention.

FIG. 4 is an example of a circuit diagram of a pathmetric calculation circuit of a Viterbi decoding circuit according to this embodiment of the present invention. This pathmetric calculation circuit is a decoding circuit for decoding data played back from a recording medium in accordance with the state transition diagram of FIG. 1. This circuit inputs 5-value data that includes an error played with the characteristics PR (1, 1, 1, 1) and which is digitized to a resolution of at least $\frac{1}{10}$ by an A/D conversion circuit (not shown in the drawing), and outputs the path memory control signals SEL0 and SEL5 to a path memory shown in FIG. 7. The path memory shown in FIG. 7 outputs corrected 0 and 1 data, and forms, along with the pathmetric calculation circuit shown in FIG. 4, the data decoding apparatus of the present invention. In the example shown in FIG. 4, an overflow prevention circuit for preventing overflow when performing the pathmetric calculation has been omitted. The path memory shown in FIG. 7 will be described in further detail later.

The reference symbols a, b, c, d, e, and f in FIG. 4 denote corrected playback waveform target values from the recording medium. In the case of playback from the medium according to the state transition diagram shown in FIG. 1, according to the various states shown in FIG. 1, these target values a, b, c, d, e, and f can be set to +1, +2, 0, 0, −2, and −1, respectively.

A description of the operation of the pathmetric calculation circuit of FIG. 4 follows.

In FIG. 4, the output of a playback system such as shown in FIG. 3 is sampled by a bit clock using an A/D conversion circuit (not shown in the drawing), resulting in the data yk, which includes an error, this being supplied to the calculators 2 to 7. At these calculators 2 to 7, target values a, b, c, d, e, and f are supplied from the target value control circuit 1. By doing this, the target values a, b, c, d, e, and f are subtracted from the sampled data yk. The calculated outputs of the calculators 2 to 7 are supplied to the corresponding squaring circuits 8 to 13, respectively.

At the squaring circuits 8 to 13, the distance error from the calculated outputs from the corresponding calculators 2 to 7 are calculated. That is, from the squaring circuits 8 to 13, $(yk-a)^2$, $(yk-b)^2$, $(yk-c)^2$, $(yk-d)^2$, $(yk-e)^2$, and $(yk-f)^2$ are obtained as the distance errors. These error signals are sent to corresponding calculators 14 to 19, respectively, and of the error signals the outputs of the squaring circuits 8, 9, 12, and 13, these being specifically $(yk-a)^2$, $(yk-b)^2$, $(yk-e)^2$, $(yk-f)^2$, are returned to the target value control circuit 1.

At the calculators 14 to 19, the metric values calculated at the immediately previous sample (L011, L111, L110, L001, L000, L100) are added respectively to each of the supplied error signals. The calculation results from these calculators 14 to 19 are taken as the metric values of the current sample. The values L011, L111, L110, L001, L000, and L100 indicate the metric values of states S1, S0, S2, S3, S5, and S4 respectively (shown in FIG. 1 and FIG. 2).

Control of the path memory into which are stored the decoding data series is performed based on the above-noted metric values, and in the case of this embodiment it is sufficient to select only the data input in the S0 and S5 states.

In the example shown in FIG. 4, therefore, in the comparator circuit 21 selection is made of the path to state S0 from state S0 or from state S1, by means of a comparison of the metric values L111 and L011 of the current sample. Even for state S5, in the same manner in the comparator 24 selection is made of the path to state S5 from state S5 or from state S4, by means of a comparison of the metric values L100 and L000 of the current sample. The information for the comparison results of the comparators 21 and 24 are sent to the run length counters 20 and 25, and are also output to the path memory, to be described below, as the path memory control signals (path memory selection signals) SEL0 and SEL5.

The operation of the run length counters 20 and 25 that output information that generates the target value control signals is as follows.

Figure 5:
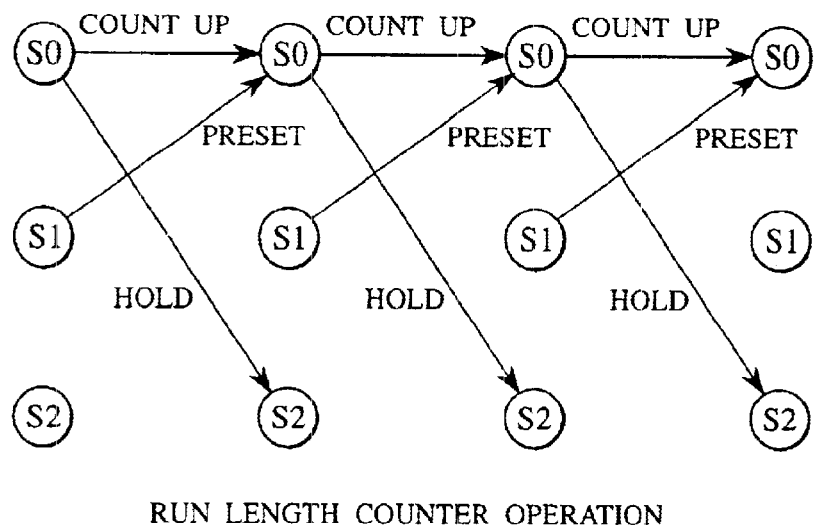
FIG. 5 is a drawing illustrating the run length counter operation provided in the pathmetric calculation circuit according to an embodiment of the present invention.

First, referring to FIG. 5, the run length counter 20 operates as follows.

At the comparator circuit 21 for the metric values L011 and L111, as described above, the sizes of the metric values are compared in order to establish whether the path to state S0 is from state S0 or from state S1.

In making this comparison, if L011>L111, the path is from state S0, and if L111>L011, the path is from state S1. (If these metric values are equal, the path can be either of the options.)

If the comparator circuit selects the path from the state S1 and outputs, for example, "0", the run length counter 20 is preset. In the case in which the branch is from the state S0 and outputs "1", the run length counter is incremented, and if the branch is to state S2, the count value of the run length counter 20 is held.

Because the run length counter 20 is constantly operating so as to count the "1" run length, even for if the supplied playback signal is not "1" (for example, if it is smaller than "0"), it continues to count and be reflected in target value control, thereby adversely affecting data decoding.

In this embodiment, therefore, based on the error signal input from the squaring circuits 8, 9, 12, and 13 to the target value control circuit 1 (the above-noted distance error signal), a determination is made as to whether or not the counter value shall be reflected in the target value control.

For example, in the case of a counter controlled by the path to state S0, the reference target value (before a change) is a=+1, b=+2. Under these conditions, the error values (outputs of the squaring circuits 8 and 9) for the case in which an input of a playback waveform in the region of the states S0 and S1 (for example, yk=1.5) are both 0.25. Because e=−2, the output of the squaring circuit 12 corresponding to the state S5 is 12.25, this representing quite a large error.

In this embodiment, therefore, a threshold value (for example, 6.25) is preset in the target value control circuit 1, and when this value is not exceeded, the value of the run length counter 20 is reflected in a change of the target value. If, however, there is even one case of exceeding the threshold value, target value control is not performed. In the above-noted example, because the output of the squaring circuit 12 does exceeds 6.25, control of the target value is not performed. While the same value can be used for the error signals from each of the squaring circuits 8, 9, 12, and 13, it is alternately possible, as described below, to establish a threshold value table in the target value control circuit 1, in which threshold values differ between the various error signals (or at least for some part of the error signals).

Almost the same is the case for the run length counter 25. At the state S5, if a path to the state S4 is selected (metric value L100), the run length counter 25 is preset (that is, the count value is cleared), and when a path from state S5 is selected (metric value L000), the run length counter 25 is incremented (that is, the run length of 0s is counted).

With regard to compensation, as noted above the amplitude compensation value is substantially established by a prior pit or land length (run length of 0s or 1s).

Figure 6:
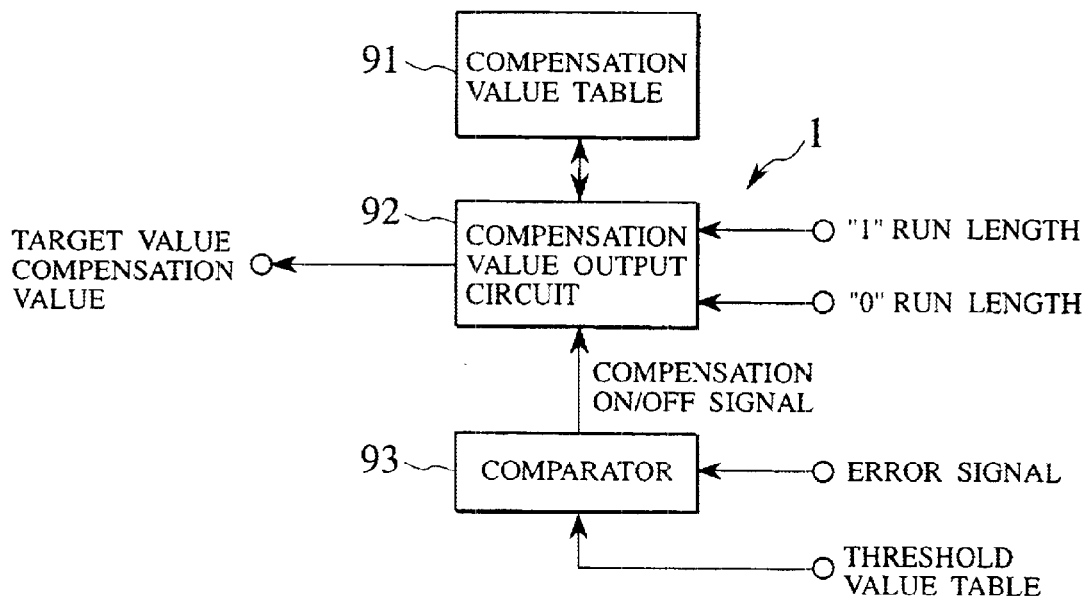
FIG. 6 is a block diagram showing an example of the configuration of a target value control circuit.

In view of this, one approach that can be envisioned is that of priorly storing a compensation amount with respect to the prior bit length into the target value control circuit 1, and adding to or subtracting this value from the a, b, c, d, e, and f of the pathmetric calculation circuit, FIG. 6 shows an example of the configuration of the target value control circuit 1.

In the circuit shown in FIG. 6, a threshold value table of threshold values for the output error signals of the squaring circuits 8, 9, 12, and 13 is pre-established and stored in accordance with waveform equalization characteristics as noted above.

At the comparator (monitoring means) 93 a comparison is performed between the above-noted error signals and the threshold values of the threshold value table, a compensation on/off signal is generated, and this compensation on/off signal is sent to the compensation value output circuit 92. More specifically, of the error signals, if there is even one error signal that exceeds its corresponding threshold value, because there is a high probability that the run length counter 20 or 25 is misoperating, a compensation OFF signal is output. If, however, all the error signals are below the corresponding threshold values, the compensation ON signal is output.

If the prior bit length is 3T is within the threshold value, if compensation is performed by the compensation value output circuit 92 in response to a compensation ON signal supplied thereto from the comparator 93, compensation values corresponding to a, b, c, d, e, and f, which differ depending upon the "1" run length supplied from the run length counter 20 or the "0" run length supplied from the run length counter 25 are selected from the compensation table 91 and output as target compensation values. For example, if the compensation values corresponding to the values of a, b, c, d, e, and f stored in the compensation value table 91 are a1, b1, c1, d1, e1, and f1, the values output from the compensation value output circuit 92 are a1, b1, c1, d1, e1, and f1, and the error signals output from the squaring circuits 8 to 13 are $(yk-a1)^2$, $(yk-b1)^2$, $(yk-c1)^2$, $(yk-d1)^2$, $(yk-e1)^2$ and $(yk-f1)^2$.

The compensation values stored in the compensation table 91 are different, depending upon the values of the "1" run length and the "0" run length and, because the values of the "1" run length and the "0" run length supplied from the run length counters 20 and 25 are incremented (reset) each time, a corresponding compensation value is read from the compensation value table 91 and output each time by the compensation value output circuit 92 as the target compensation value.

The target compensation value is determined in this manner in accordance with the "1" run length or "0" run length supplied from the run length counter 20 or 25, the determination of whether or not compensation is to be performed (that is start and stop of the compensation operation) being made in accordance with a compensation ON/OFF signal supplied from the comparator 93.

Figure 7:
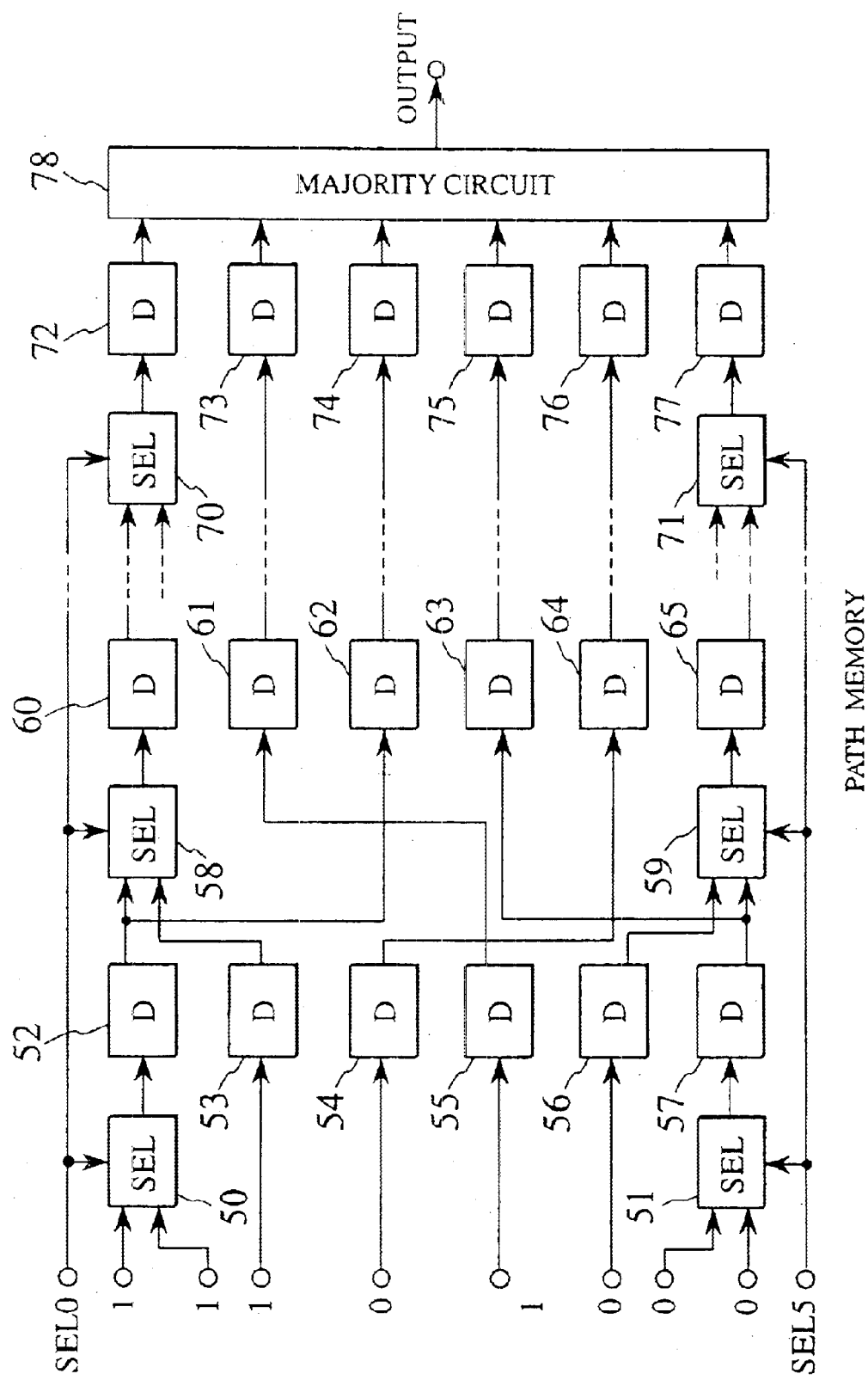
FIG. 7 is a block diagram showing an example of the configuration of a path memory corresponding to the pathmetric calculation circuit of FIG. 4.

FIG. 7 shows an example of the configuration of a path memory circuit with respect to the pathmetric calculation circuit of FIG. 4. This path memory circuit is a hardware implementation of the decoding trellis shown in FIG. 2.

In the circuit shown in FIG. 7, the outputs of comparator circuits 21 and 24 of the pathmetric calculation circuits are converted to the path memory control signals SEL0 and SEL5 that select a path selected by the outputs of comparator circuits 21 and 24 and supplied to the path memory circuit. Selectors 50 and 51 and delay circuits 53 to 56 are supplied with a "1" or "0", in accordance with the decoding trellis shown in FIG. 2.

The selectors 50 and 51, in response to the path memory control signals SEL0 and SEL5, select one of the two supplied data and output the data to the delay circuits 52 and 57. At the delay circuits 52 to 57, the supplied data is latched at each sampling clock so as to establish the timing of output thereof.

The selectors 58 and 59 select the outputs of the delay circuits 52 and 53 or the outputs of the delay circuits 56 and 57, in accordance with the path memory control signals SEL0 and SEL5, and output these to the delay circuits 60 and 65, and at the delay circuits 60 to 65, the supplied data is latched at each sampling clock so as to establish the timing of output thereof.

The same type of operations are repeated thereafter, a value of "1" or "0" output from the delay circuits 72 to 77 being supplied to the majority circuit 78, which performs a majority operation, the output of which is output as the likelihood value "1" or "0".

As described above, according to this embodiment of the present invention, in a pathmetric calculation circuit, when performing Viterbi decoding in accordance with a trellis, detection is performed of a prior pit or land length, the result of this detection being used as the basis for varying the target value of the pathmetric calculation. By doing this, it is possible to perform decoding under good conditions, even in the case of bits that are affected by playback signal amplitude variations due to a prior pit or land length that is attributable to an improvement in recording density, thereby achieving a high-quality playback apparatus.

According to this embodiment of the present invention, even in the case in which an improvement in recording density results in a prior pit or land length that affects the playback signal amplitude of a subsequent bit, it is possible to perform pathmetric calculations at all times with the optimum values, thereby enabling the achievement of a high-quality playback signal.

It will be understood that the above-noted embodiment is merely one example of the present invention, that the present invention is not limited to this embodiment, and that the present invention can take on many varied forms within the scope of the technical concept thereof.

In a data decoding apparatus as recited, whereby Viterbi decoding is performed in accordance with a decoding trellis based on the characteristics of the recorded signal, by providing the pathmetric calculation circuit with a means for detection of the run length of the recorded data, it is possible to make small the non-linear influence of prior recorded pit length or land length on a subsequent bit, attributed to an improvement in recording density, and it is further possible to perform high-quality decoding even for a bit that is affected by a variation in playback signal amplitude.

In a data decoding apparatus as recited, by providing a target value variation means that varies the target value for metric calculations of Viterbi decoding, based on run length information detected by the run length detection means, it is possible to make small the non-linear influence of prior recorded pit length or land length on a subsequent bit, attributed to an improvement in recording density, and it is further possible to perform high-quality decoding even for a bit that is affected by a variation in playback signal amplitude.

In a data decoding apparatus as recited, the run length detection means is a counter for counting the run length and, by providing a monitoring means for protecting against faulty operation caused by using a count value that should not be used as an information source, it is possible to make small the non-linear influence of prior recorded pit length or land length on a subsequent bit, attributed to an improvement in recording density, and it is further possible to perform high-quality decoding even for a bit that is affected by a variation in playback signal amplitude.

More specifically, according to the present invention, in a pathmetric calculation circuit when performing Viterbi decoding in accordance with a decoding trellis, by providing a detection means for detecting a prior pit or land length, and a variation means for varying the target value of the metric calculation based on the results of the run length detection, even in the case in which the length of a prior pit or land, due to improvement in recording density, greatly influences a subsequent bit (that is, the case in which the playback signal amplitude is affected), it is possible to perform signal playback (decoding) under good conditions at all times, thereby achieving a high-quality playback signal.

What is claimed is:

1. A data decoding apparatus performing decoding of recorded data played back from a recording medium, using Viterbi decoding in accordance with a decoding trellis based on a recorded signal characteristic, comprising:

means for detecting a run length of the recorded data, wherein the run length detecting means is provided in a pathmetric calculation circuit; and target value variation means for varying a target value which is used for performing a metric calculation of Viterbi decoding, based on the run length detected by the run length detecting means;

wherein the run length detecting means is a counter for counting the run length, and wherein the target value variation means comprises means for monitoring an error signal so that an erroneous count value output from the counter is not used to vary the target value.

2. A data decoding method of performing decoding of recorded data played back from a recording medium, using Viterbi decoding in accordance with a decoding trellis based on a recorded signal characteristic, comprising the steps of:

detecting a run length of the recorded data during pathmetric calculation, varying a target value, which is used for performing a metric calculation in Viterbi decoding, based on the run length detected by the run length detecting step;

monitoring an error signal so that an erroneous count value output from a counter is not used to vary the target value.

* * * * *